United States Patent
Ueno et al.

(10) Patent No.: US 8,153,454 B2
(45) Date of Patent: Apr. 10, 2012

(54) FABRICATION APPARATUS AND FABRICATION METHOD OF SEMICONDUCTOR DEVICE PRODUCED BY HEATING SUBSTRATE

(75) Inventors: Masaki Ueno, Itami (JP); Toshio Ueda, Itami (JP); Yoko Watanabe, Osaka (JP)

(73) Assignee: Sumitomo Electric Industries, Ltd., Osaka-shi, Osaka (JP)

( * ) Notice: Subject to any disclaimer, the term of this patent is extended or adjusted under 35 U.S.C. 154(b) by 715 days.

(21) Appl. No.: 12/209,397

(22) Filed: Sep. 12, 2008

(65) Prior Publication Data

US 2009/0075409 A1 Mar. 19, 2009

(30) Foreign Application Priority Data

Sep. 14, 2007 (JP) ................. 2007-239262

(51) Int. Cl.
*H01L 21/00* (2006.01)
(52) U.S. Cl. ............ 438/22; 118/58; 118/722; 118/724; 118/725; 257/E21.001
(58) Field of Classification Search ............ 118/58
See application file for complete search history.

(56) References Cited

U.S. PATENT DOCUMENTS 7,544,251 B2 6/2009 Holland et al.
2007/0139856 A1 6/2007 Holland et al.

FOREIGN PATENT DOCUMENTS

| JP | 4-238893 | | 8/1992 |
| JP | 2004-103708 | A | 4/2004 |
| KR | 10-2000-0070401 | A | 11/2000 |
| KR | 10-2006-0052119 | A | 5/2006 |
| WO | WO 98/32893 | | 7/1998 |
| WO | 03/096396 | | 11/2003 |

*Primary Examiner* — Thanh Nguyen
(74) *Attorney, Agent, or Firm* — Drinker Biddle & Reath LLP

(57) ABSTRACT

A fabrication apparatus and fabrication method of a semiconductor device are provided, allowing the temperature distribution of a substrate to be rendered uniform. The fabrication apparatus for a semiconductor device includes a susceptor holding the substrate, a heater arranged at a back side of the susceptor, a support member located between the substrate and susceptor, including a support portion, and a spacer located between the susceptor and support member. The spacer has an opening formed corresponding to the site where said support portion is located, at an opposite face side of the support member.

6 Claims, 9 Drawing Sheets

FABRICATION APPARATUS AND FABRICATION METHOD OF SEMICONDUCTOR DEVICE PRODUCED BY HEATING SUBSTRATE

BACKGROUND ART

1. Technical Field

The present invention relates to a fabrication apparatus and fabrication method of a semiconductor device, particularly a fabrication apparatus and fabrication method of a semiconductor device produced by heating a substrate.

2. Description of Related Art

In the fabrication of semiconductor devices such as optical devices and electronic devices, a semiconductor substrate is generally heated in a chamber (reaction chamber), followed by execution of various chemical and physical processing during the heating. For example, formation of an epitaxial film on a substrate is carried out by supplying material gas into the chamber and growing a film epitaxially, based on the material gas component, on the surface of the heated substrate. In this case, it is important to reduce the temperature distribution of the substrate in the chamber in order to grow a film of high quality uniformly on the substrate. In other words, rendering the temperature distribution of the substrate uniform is critical to ensure the reliability and quality of the semiconductor device, in addition to improving the yield.

Various approaches are conventionally proposed to render the substrate temperature distribution uniform. For example, WO 2003/096396 discloses the approach of suppressing a temperature gradient that will be developed at a substrate during high-temperature processes by suspending a substrate on a support structure having a specified height, made from a material having a relatively low thermal conductivity, located on a susceptor.

According to the technique disclosed in WO2003/096396, the thermal flux through the support structure tends to become greater than the thermal flux through the gas at the gap between the substrate and the susceptor. Accordingly, the temperature of the substrate at the region in contact with the annular support structure increases. As a result, the temperature of the substrate will be high at the outer peripheral region and low at the central region, leading to the problem that a temperature distribution is readily developed.

SUMMARY OF THE INVENTION

In view of the foregoing, a main object of the present invention is to provide a fabrication apparatus and fabrication method of a semiconductor device, allowing a uniform temperature distribution of the substrate.

A fabrication apparatus for a semiconductor device according to the present invention includes a susceptor holding a substrate. The fabrication apparatus also includes a heater member arranged at a back side of the susceptor, opposite to the side where the susceptor holds the substrate, for heating the substrate. Furthermore, the fabrication apparatus includes a support member located between the substrate and the susceptor, and a spacer located between the susceptor and the support member. The support member includes a support portion supporting the substrate. The spacer has an opening formed corresponding to the site where the support portion is located, at the opposite face side of the support member.

According to this configuration, the substrate is brought into contact with only the support portion of the support member, avoiding overall contact with the support member. Therefore, the conventional contact between the substrate and the support member, concentrated at one site by warping caused during the heating step of the substrate, will not occur. Furthermore, since a spacer having an opening formed is employed, the amount of heat applied directly to the support portion of the support member from the susceptor by heat conductance is reduced as compared to the case where an opening is not formed. In other words, the heat from the heater member located at the back side of the susceptor will not be readily conveyed to the support portion of the support member. As a result, the heat transfer to the region of the substrate in contact with the support portion is reduced. Accordingly, development of a temperature distribution at the substrate due to the temperature increase at the region of the substrate in contact with the support portion can be suppressed. Thus, the temperature distribution of the substrate can be rendered uniform.

In the fabrication apparatus for a semiconductor device set forth above, the opening formed at the spacer is preferably filled with a material having a thermal conductivity lower than the thermal conductivity of the spacer. Heat transfer from the heater member located at the back side of the susceptor to the support portion of the support member can be reduced, not only by the configuration in which a gap is provided by means of an opening, between the site where the support portion of the support member is located and the susceptor, but also by the configuration in which the opening is filled with a material of low thermal conductivity. Therefore, development of a temperature distribution at the substrate caused by the increase in temperature at the region of the substrate in contact with the support portion can be suppressed. Thus, the temperature distribution of the substrate can be rendered uniform.

Preferably, the support portion supports the outer peripheral region of the substrate. Although the temperature distribution of the substrate is rendered uniform due to reduction in the heat transfer towards the region of the substrate in contact with the support portion, a slight temperature gradient will be developed at the region of the substrate in contact with the support portion. In a semiconductor device, the outer peripheral region of the substrate is generally not used to function as a device. Therefore, by virtue of a configuration in which the support portion supports a region of the substrate at the outer peripheral region of a finite width, the effect of the temperature gradient developed at the region of the substrate in contact with the support portion on the device performance can be suppressed.

Preferably, the support portion is formed of at least three projections. Although the support portion may be formed in a ring shape supporting the outer peripheral region of the substrate entirely along the circumference, the area of contact between the substrate and the support member can be reduced by forming the support portion as projections. As a result, temperature increase at the region of the substrate in contact with the support portion can be suppressed to allow the temperature distribution of the substrate rendered more uniform.

A fabrication method of a semiconductor device according to the present invention employs any of the fabrication apparatuses set forth above. The fabrication method includes the steps of loading a substrate to a susceptor, and heating the substrate by a heater member. Accordingly, the substrate can be heated uniformly. Thus, a semiconductor device can be fabricated, having a semiconductor film of uniform property formed by the supply of raw material to the surface of a substrate that is heated uniformly.

Preferably, a semiconductor includes a nitride type compound semiconductor. In a nitride type compound semiconductor, the property of an epitaxial layer formed at the surface of the substrate is readily affected by the growth temperature. At the time of growing a film of nitride type compound semiconductor, gas having a thermal conductivity lower than that of hydrogen, such as nitrogen and ammonia, is generally employed. Therefore, the epitaxial layer is readily affected by the temperature distribution caused by the thermal conductance through the contact between the susceptor and the substrate, in the ambient of growing a nitride type compound semiconductor film. By virtue of the configuration of the present invention, the heat conductance from the support portion to the substrate can be suppressed. Therefore, temperature increase at the region of the substrate in contact with the support portion can be prevented. Thus, the temperature distribution of the substrate can be rendered uniform.

Preferably, the semiconductor device includes a semiconductor light emitting element. The light emitting element of a nitride type compound semiconductor generally has InGaN containing In as the active layer. The In composition of InGaN is particularly susceptible to the growth temperature. Since heat conductance from the support portion to the substrate can be suppressed according to the configuration of the present invention, temperature increase at the region of the substrate in contact with the support portion can be suppressed. Therefore, the temperature distribution of the substrate can be rendered uniform.

According to the fabrication apparatus and fabrication method of a semiconductor device of the present invention, the temperature distribution of the substrate can be rendered uniform.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
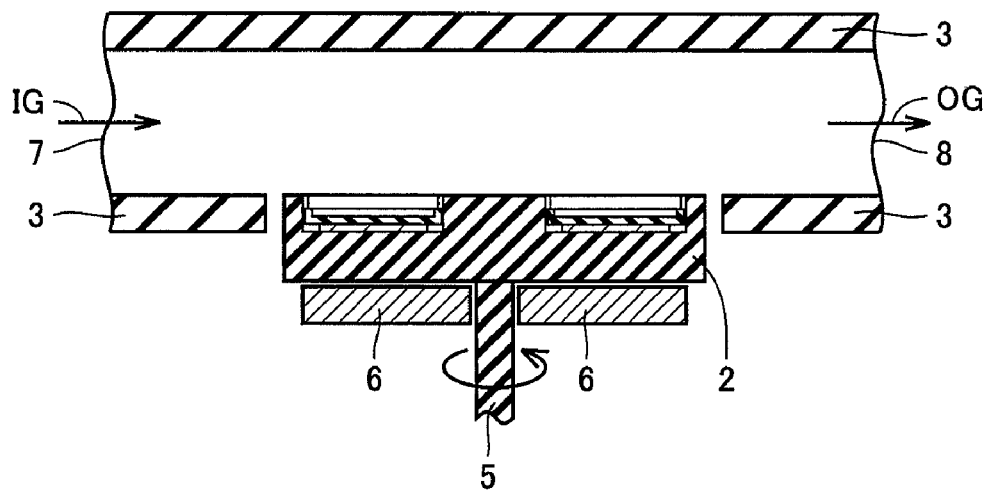
FIG. 1 is a schematic sectional view of an example of a fabrication apparatus for a semiconductor device.

Embodiments of the present invention will be described hereinafter with reference to the drawings. In the drawings, the same or corresponding elements have the same reference characters allotted, and description thereof will not be repeated.

Referring to FIG. 1, a fabrication apparatus for a semiconductor device is a vapor deposition apparatus, including a susceptor 2 holding a substrate, in a chamber 3. A plurality of pockets 4, identified as pits, are formed at the surface of susceptor 2. A substrate is loaded in pocket 4. At the back side of susceptor 2 that is opposite to the side where the substrate is loaded in susceptor 2 (the side face where pocket 4 is formed at susceptor 2, and where the substrate is held at susceptor 2), a heater 6 is provided. Heater 6 corresponds to a heater member heating the substrate with susceptor 2 therebetween. Heater 6 may be configured to be attached to and held by susceptor 2 or may be arranged at the back side of susceptor 2, supported independent of susceptor 2. A support shaft 5 is provided at the center region and back side of susceptor 2. Support shaft 5 is driven by the motive energy from a rotary motor, not shown, to be rotated. The rotation of support shaft 5 causes susceptor 2 to rotate in the horizontal direction together with support shaft 5.

The raw material gas qualified as the material for film forming is supplied into chamber 3 from a raw material gas supply inlet 7, qualified as a raw material supply portion, as indicated by arrow IG. By supplying the raw material gas to the surface of a substrate in chamber 3, a semiconductor film (epitaxial film) is grown at the surface of the substrate that is heated by heater 6. The raw material gas after a semiconductor film is formed is emitted from an exhaust outlet 8, as indicated by arrow OG.

Figure 2:
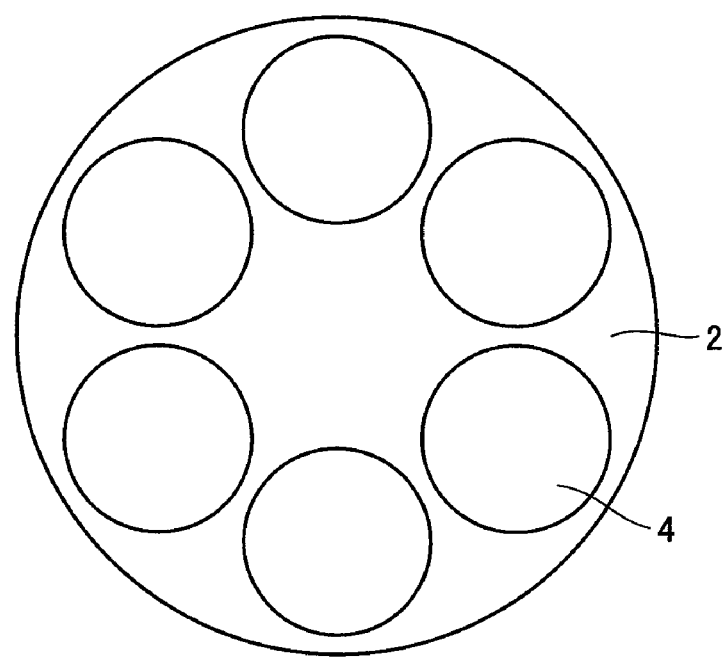
FIG. 2 is a top plan view of a susceptor of FIG. 1.

FIG. 2 represents susceptor 2 of FIG. 1, viewed from the upper side of FIG. 1. Referring to FIG. 2, six pockets 4, identified as pits, are formed at the surface of susceptor 2. A substrate is loaded in pocket 4 to be held by susceptor 2.

Figure 3:
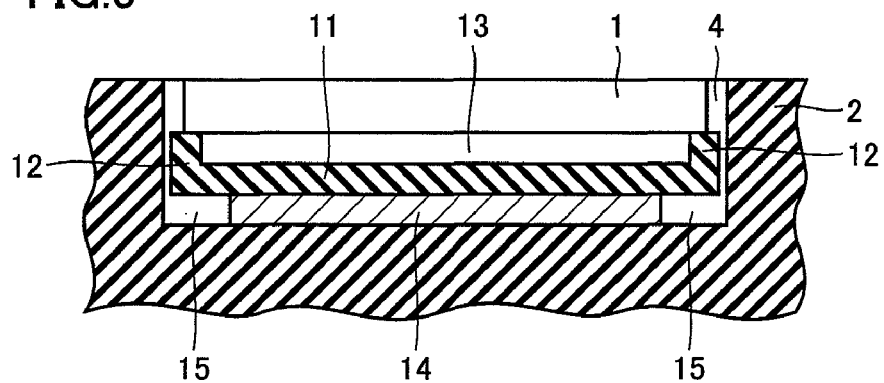
FIG. 3 is a schematic diagram representing a substrate held at a susceptor.

As shown in FIG. 3, a support member 11 for supporting a substrate 1, and a spacer 14 are provided in pocket 4 formed in susceptor 2. Support member 11 arranged in pocket 4 of susceptor 2 has a plane shape substantially equal to that of substrate 1, and is located between substrate 1 and susceptor 2. Support member 11 includes a support portion 12 where substrate 1 is supported. Support portion 12 supports the outer peripheral region of substrate 1 such that support member 11 is brought into contact with the outer peripheral region of substrate 1 through support portion 12. By the provision of support portion 12 at the outer peripheral region of support member 11, support member 11 forms contact with substrate 1 at the outer peripheral region, but not at the center region. There is a gap 13 between substrate 1 and support member 11 excluding the region of support portion 12. Support member 11 is brought into contact with substrate 1 through support portion 12 constituting a portion of support member 11, avoiding overall contact between substrate 1 and support member 11.

A spacer 14 is located between susceptor 2 and support member 11 in pocket 4 of susceptor 2. Spacer 14 is arranged to form contact with support member 11 at a side opposite to the side where support member 11 faces substrate 1. Furthermore, spacer 14 has an opening formed corresponding to the site where support portion 12 of support member 11 is formed (i.e. the outer peripheral region of support member 11), at the opposite face side of support member 11. As a result, a gap 15 is formed between susceptor 2 and the opposite face side of support member 11, corresponding to the site where support portion 12 is located.

Gap 15 is filled with gas of low thermal conductivity. Therefore, the heat from susceptor 2 is not readily transmitted to support member 11 at the outer peripheral region where support portion 12 is formed. In other words, the region of support member 11 where support portion 12 is formed will not directly receive heat from susceptor 2 through heat conductance since contact with susceptor 2 is avoided. Therefore, the temperature of support portion 12 is reduced as compared to the case where support member 11 forms contact with susceptor 2. As a result, the heat transfer to the outer peripheral region of substrate 1 where contact between support portion 12 and substrate 1 is established is reduced. Therefore, generation of a temperature distribution at substrate 1 can be suppressed. In other words, particular temperature increase at the outer peripheral region of substrate 1 to cause development of a large temperature distribution at substrate 1 can be suppressed. Therefore, the temperature distribution of substrate 1 can be rendered uniform. By adjusting the width of gap 15 (in other words, by adjusting the dimension of spacer 14 in the radial direction of pocket 4), the temperature distribution at the surface of substrate 1 can be rendered optimum.

Although the temperature distribution of substrate 1 is rendered uniform due to reduction in the heat transfer towards the outer peripheral region of substrate 1, a slight temperature gradient will be developed at the region of substrate 1 in contact with support portion 12. Namely, the outer peripheral region of substrate 1 in contact with support portion 12 is higher in temperature than the central region of substrate 1. However, in a semiconductor device, the outer peripheral region of substrate 1 is generally not used to function as a device. Therefore, by virtue of a configuration in which support portion 12 supports the outer peripheral region of substrate 1, the effect of the temperature gradient developed at the region of substrate 1 in contact with support portion 12 on the device performance can be suppressed.

Figure 4:
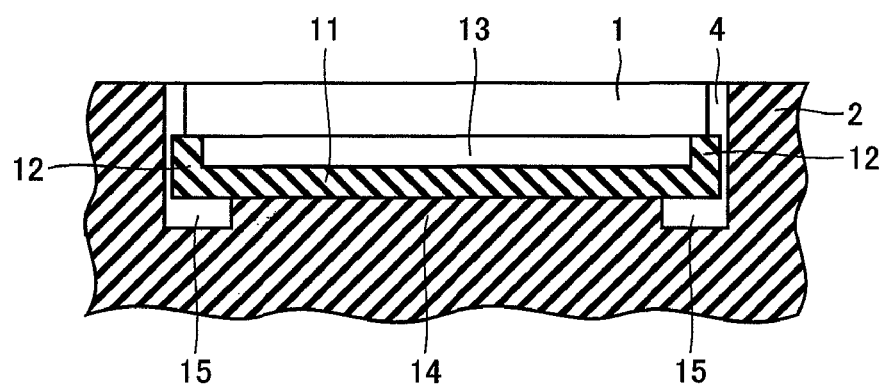
FIGS. 4, 5, and 6 are schematic diagrams of first, second, and third modifications, respectively, representing a substrate held at a susceptor.
Figure 5:
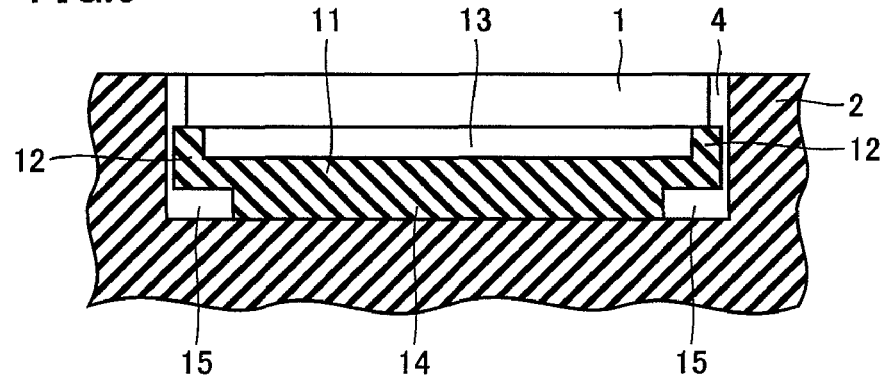

In the configuration shown in FIG. 4, spacer 14 is formed integral with susceptor 2. In the configuration shown in FIG. 5, spacer 14 is formed integral with support member 11. Gap 15 is provided between susceptor 2 and the opposite face side of support member 11, corresponding to the site where support portion 12 is located, in both the configurations of FIG. 4 and FIG. 5. By virtue of the reduction in the heat transfer towards the outer peripheral region of substrate 1 in contact with support portion 12, development of a temperature distribution at substrate 1 can be suppressed. Thus, the temperature distribution of the substrate can be rendered uniform.

Figure 6:
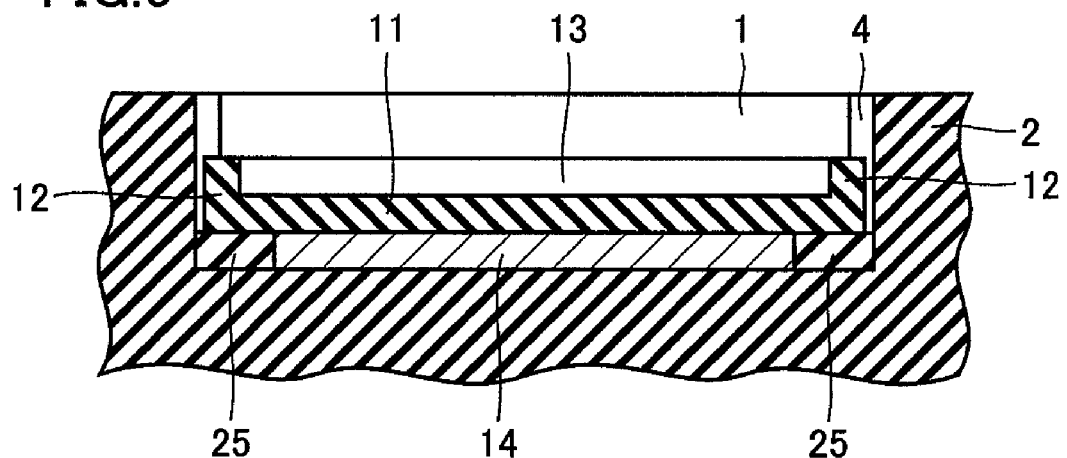

In the configuration shown in FIG. 6, a filler 25 is disposed between susceptor 2 and support member 11 corresponding to the site where support portion 12 is formed, at the opposite face side of support member 11. Filler 25 includes a material of lower thermal conductivity than spacer 14. Specifically, the opening of spacer 14 is filled with filler 25, identified as a material of lower thermal conductivity than spacer 14.

Heat transfer from heater 6 located at the back side of susceptor 2 to support portion 12 can be reduced, not only by the configuration in which a gap 15 is provided by means of an opening in spacer 14, between the site where support portion 12 of support member 11 is located and susceptor 2, but also by the configuration of FIG. 6 in which the opening is filled with a filler 25 of low thermal conductivity. Therefore, development of a temperature distribution at substrate 1 caused by the increase in temperature at the region of substrate 1 in contact with support portion 12 can be suppressed. Thus, the temperature distribution of substrate 1 can be rendered uniform.

Figure 7:
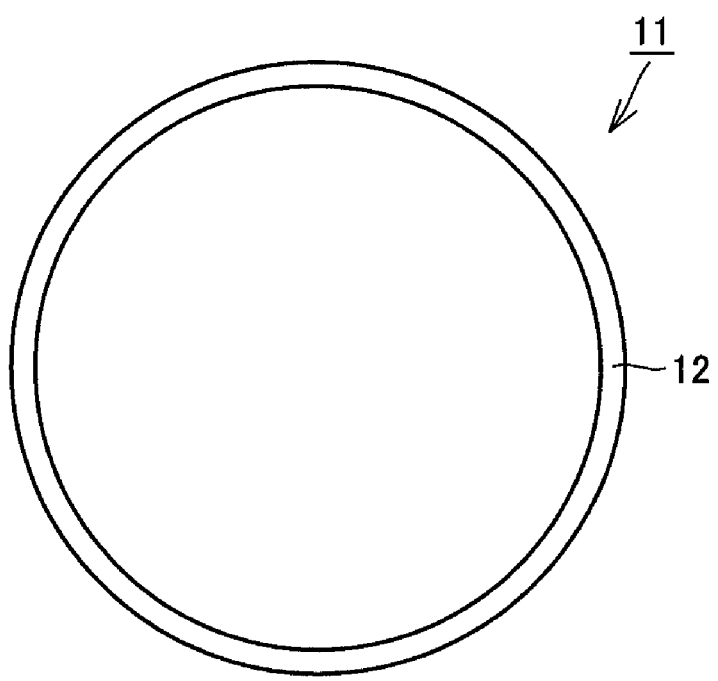
FIG. 7 is a plan view of an example of the support member shown in FIGS. 3-6.

The configuration of support member 11 will be described hereinafter. FIG. 7 represents support member 11 of FIGS. 3-6, viewed from the side where a substrate is loaded to support member 11 (in other words, from the top of FIGS. 3-6). Referring to FIG. 7, an annular support portion 12 is formed at the outer peripheral region of support member 11. Support portion 12 of FIG. 7 is configured to support the outer peripheral region of substrate 1 along the entire circumference.

In this case, spacer 14 can be configured to have an opening formed corresponding to the site where support portion 12 is located, at the opposite face side of support member 11, matching the annular configuration of support portion 12. For example, spacer 14 can be configured to allow a gap 15 to be provided between susceptor 2 and the site where support portion 12 is located.

Spacer 14 may take any shape as long as the effect of rendering the temperature distribution of substrate 1 uniform can be achieved by suppressing heat transfer from susceptor 2 to support portion 12. Namely, spacer 14 takes a configuration in which the thermal conductivity of the region at the opposite face side of support member 11, corresponding to the site where support portion 12 is located, is reduced. For example, spacer 14 may take a configuration in which the contacting area with spacer 14, at the opposite face side of support member 11, corresponding to the site where support portion 12 of support member 11 is located, is reduced, or a configuration in which the void fraction of the portion corresponding to the site where support portion 12 of support member 11 is formed, is increased.

More specifically, spacer 14 can be formed to take a shape to avoid any contact at the side of support member 11 opposite to the side where support portion 12 is formed, such as a disk smaller in diameter than the inner diameter of annular support portion 12 shown in FIG. 7. Alternatively, spacer 14 can be formed having a plurality of holes passing through the thickness of spacer 14, at the outer peripheral region of spacer 14, while having an outer shape identical to that of support member 11 in plane. Alternatively, a surface coat material and a porous material inside constituting the portion of spacer 14 corresponding to the site where support portion 12 is formed can be provided. Although the area of contact between support member 11 and spacer 14 is not reduced in this configuration, the advantage of suppressing heat transfer from susceptor 2 to support portion 12 can similarly be achieved by the reduction of the thermal conductivity.

Figure 8:
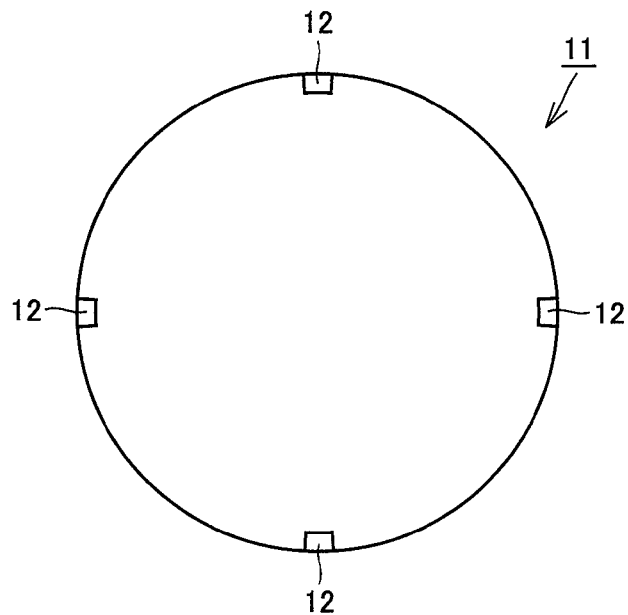
FIG. 8 is a plan view of a modification of the support member shown in FIGS. 3-6.

Support portion 12 of FIG. 8 is formed having four projections located at the outer peripheral region of support member 11. The projecting support portion 12 of FIG. 8 is configured to support the outer perimeter of substrate 1 at four sites. In this case, spacer 14 may have an opening formed at four sites corresponding to the location of the four projecting support portions 12. For example, spacer 14 can be subjected to notching or drilling at the four sites located along the outer circumference of the disk.

By forming support portion 12 in a projection shape, the area of contact between substrate 1 and support member 11 can be reduced. As a result, temperature increase in substrate 1 at the area in contact with support portion 12 can be suppressed. The temperature distribution of the substrate can be rendered further uniform.

The number of projections for support portion 12 is not limited to the four projections shown in FIG. 8. The outer peripheral region of substrate 1 can be supported by forming at least three projections at the outer peripheral region of support member 11. Furthermore, the shape of the projection is not limited to that shown in FIG. 8. For example, an arbitrary shape can be employed such as a hemisphere shape, a truncated cone, a rectangular column, or the like.

The fabrication apparatus for a semiconductor device of the present invention set forth above allows contact between substrate 1 and support member 11 only at support portion 12, avoiding overall contact. Therefore, the contact between substrate 1 and support member 11 being concentrated at one site of substrate 1 such as at the center, for example, caused by the warping of substrate 1 during the heating, can be prevented.

Furthermore, since spacer 14 having an opening formed is employed, the amount of heat directly applied to support portion 12 from susceptor 2 by heat conductance is reduced as compared to the case where an opening is not formed. In other words, heat is not readily transmitted from heater 6 located the back side of susceptor 2 towards support portion 12. For example, a configuration can be employed in which support member 11 is not brought into contact with susceptor 2 and a gap 15 is provided between support member 11 and susceptor 2, at the opposite face side of support member 11, corresponding to the site where support portion 12 is located (the site where support member 11 supports substrate 1). As a result, heat transfer towards the portion of substrate 1 in contact with support portion 12 is reduced. The event of a temperature distribution being developed at substrate 1 as a result of temperature increase at the region of substrate 1 in contact with support portion 12 can be suppressed. Therefore, the temperature distribution of substrate 1 can be rendered uniform.

Support portion 12 supports the outer peripheral region of substrate 1. Since the outer peripheral region of substrate 1 for a semiconductor device is generally not used to function as a device, the configuration of support portion 12 in contact with the outer peripheral region of substrate 1, having a finite width, is advantageous in that the influence of the temperature gradient at the region of substrate 1 in contact with support portion 12 on the device performance can be suppressed.

Figure 9:
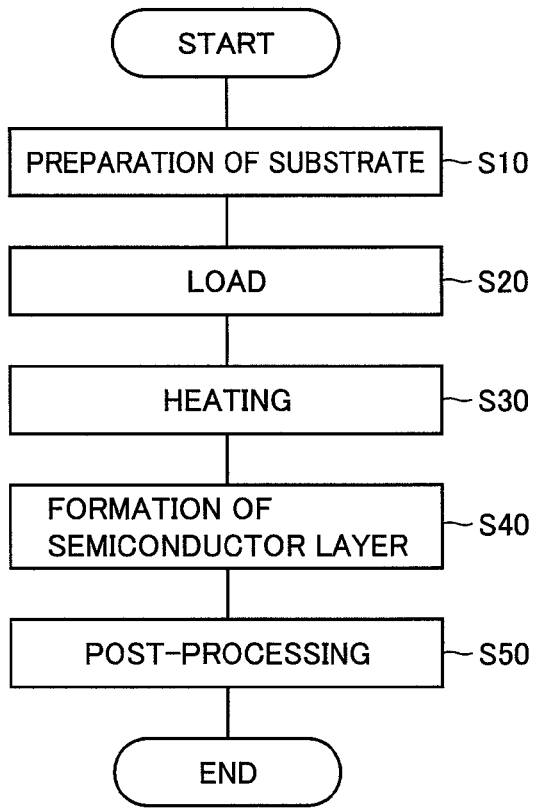
FIG. 9 is a flowchart of a fabrication method of a semiconductor device.

A fabrication method of a semiconductor device will be described hereinafter. As shown in FIG. 9, a substrate that is the subject of processing is prepared at step S10. For the material of the substrate, single crystal Si, GaAs, sapphire, InP, GaN, SiC, AlN, and the like can be employed.

At step S20, the substrate is loaded to the susceptor. Specifically, substrate 1 is disposed in pocket 4 formed at the surface of susceptor 2, described corresponding to FIGS. 3-6, for example, such that the outer peripheral region of substrate 1 is brought into contact with support portion 12 of support member 11 for support. Substrate 1 may be loaded to susceptor 2 within chamber 3, or loaded to susceptor 2 outside chamber 3, followed by placing susceptor 2 in chamber 3. After substrate 1 is loaded to susceptor 2 located in chamber 3, the ambient condition in chamber 3 is set to a predetermined condition. For example, the pressure in chamber 3 can be reduced or increased, and/or the ambient in chamber 3 may be replaced with a predetermined gas.

At step S30, the substrate is heated by a heater member. Specifically, heater 6 qualified as a heating member shown in FIG. 1 is driven. In the case where heater 6 is a resistance heating element, for example, heater 6 can be heated by applying current to heater 6. As a result, substrate 1 is heated with susceptor 2 therebetween.

At step S40, a semiconductor layer is formed at the surface of the substrate. Specifically, raw material gas including the component of the target semiconductor layer is supplied into chamber 3, as indicated by arrow IG, under the state where substrate 1 is heated. Accordingly, a film is deposited based on the component in the raw material gas at the surface of substrate 1 that is heated by heater 6 to form a semiconductor layer. The semiconductor layer can be formed by a nitride type compound semiconductor. For example, by supplying raw material gas including trimethyl gallium (TMG) and ammonia ($NH_3$), GaN can be grown epitaxially at the surface of substrate 1. As another example, by supplying raw material gas including trimethyl indium (TMI), TMG, and $NH_3$, InGaN can be grown epitaxially. The semiconductor layer may be formed of a plurality of layers stacked.

An opening is formed at spacer 14 located between support member 11 and susceptor 2. Therefore, the amount of heat transfer by the heat conductance from susceptor 2 to the region of support member 11 where support portion 12 is located is relatively reduced as compared to the case where an opening is not formed. As a result, heat transfer to substrate 1 at the outer peripheral region thereof in contact with support portion 12 is reduced. Therefore, development of a temperature distribution at substrate 1 can be suppressed. Thus, the quality of the film of the semiconductor layer formed at the surface of substrate 1 can be improved since the semiconductor layer is formed with the temperature distribution of substrate 1 rendered uniform.

At step S50, post-processing is executed. Specifically, an electrode is formed on a semiconductor layer formed at the surface of the substrate at step S40, or at the back side of the substrate. At this stage, a protection layer may be formed at the outermost surface. Further, the semiconductor substrate having a semiconductor layer and electrode formed is cut into single pieces of a semiconductor device by dicing or the like. Thus, the production of a semiconductor device ends.

Figure 10:
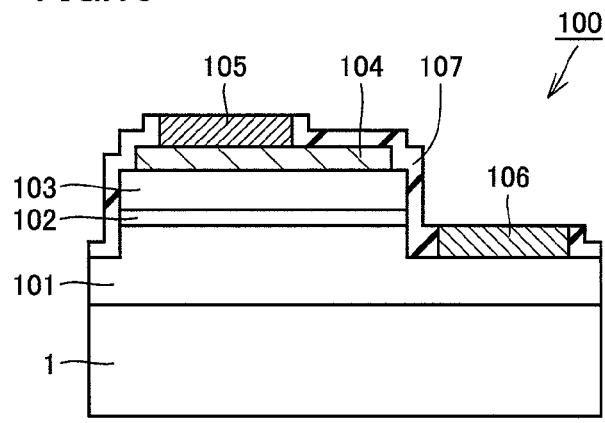
FIG. 10 is a schematic diagram of an example of a semiconductor light emitting element.

In a semiconductor light emitting element 100 of FIG. 10, an n type nitride semiconductor layer (for example n-GaN:Si) 101, a light emitting layer (for example InGaN) 102, and a p type nitride semiconductor layer (for example p-GaN:Mg) 103 are stacked on a substrate 1 that is a sapphire substrate. The electrode to conduct an electrical flow to semiconductor layers 101-103 includes a positive electrode and a negative electrode. A transparent electrode (for example Au/Ni) 104 and a p-side electrode pad 105 are provided on p type nitride semiconductor layer 103 to constitute the positive side electrode. The negative electrode has an n-side electrode pad 106 formed on n type nitride semiconductor layer 101. A protection layer (for example $SiO_2$) 107 to protect semiconductor light emitting element 100 is formed at the outermost surface.

Figure 11:
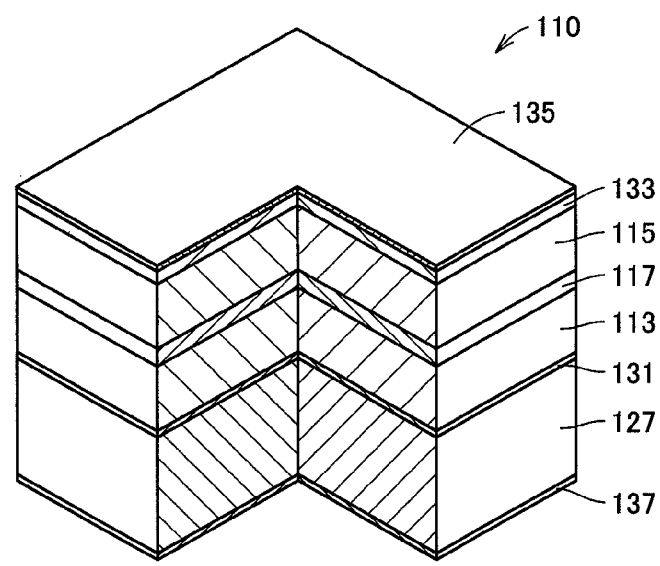
FIG. 11 is a schematic diagram representing another example of a semiconductor light emitting element.

Semiconductor light emitting element 110 of FIG. 11 includes a substrate 127 that is a Group III nitride substrate (for example GaN). On the surface of substrate 127 a buffer layer (for example AlGaN) 131 is provided to function as an underlying semiconductor region suitable for the growth of an n type nitride semiconductor layer 113. N type nitride semiconductor layer 113, light emitting layer 117, and p type nitride semiconductor layer 115 are sequentially arranged on substrate 127 with a buffer layer 131 thereunder. Light emitting layer 117 has a quantum well structure, and is provided between n type nitride semiconductor layer 113 and p type nitride semiconductor layer 115.

Semiconductor light emitting element 110 further includes a contact region 133 provided on p type nitride semiconductor layer 115, and an anode electrode 135 provided on contact region 133. Anode electrode 135 may include a semi-transparent electrode. A cathode electrode 137 is provided at the back side of substrate 127, opposite to the surface side. Electrons are supplied to light emitting layer 117 from n type nitride semiconductor layer 113. Holes are supplied to light emitting layer 117 from p type nitride semiconductor layer 115.

As mentioned above, a fabrication apparatus described according to FIGS. 1-8 is employed in the fabrication method of a semiconductor device according to the present invention. Since substrate 1 can be heated uniformly in the heating step (S30), a film of high quality can be formed uniformly on substrate 1. This allows production of a semiconductor device having a uniform property. Thus, the reliability and quality of the semiconductor device can be ensured. In addition, the yield can be improved.

In the case where the semiconductor layer formed on the surface of substrate 1 is a nitride type compound semiconductor, the property of the semiconductor layer (epitaxial layer) formed on the surface of substrate 1 is readily affected by the growth temperature. Furthermore, the property of the semiconductor layer is readily affected by the temperature distribution developed by the heat conductance caused by the contact between susceptor 2 and substrate 1 in the ambient during film forming, since gas having a thermal conductivity lower than that of hydrogen, such as nitrogen and ammonia, is generally employed. In the case where the semiconductor device is a semiconductor light emitting element, the light emitting element of the nitride type compound semiconductor generally employs InGaN including In as the active layer. The In component of InGaN is particularly readily affected by the growth temperature. In the fabrication method of a semiconductor device of the present invention, heat conductance from support portion 12 of support member 11 to substrate 1 can be suppressed. Therefore, temperature increase at the region of substrate 1 in contact with support portion 12 is suppressed to allow the temperature distribution of substrate 1 to be rendered uniform. Thus, the property of the semiconductor layer and active layer can be rendered uniform.

EXAMPLES

Conventional Example 1

A GaN substrate was set at a susceptor having a pocket with the bottom formed in the general flat profile, and epitaxial growth was effected at the surface of the GaN substrate to produce a blue LED. The susceptor was made from carbon, coated with SiC, and heated by a carbon-made resistance heating element. The susceptor revolved in orbit. Raw material gas was introduced into a reactor (chamber) made from quartz to epitaxially grow on the heated substrate a semiconductor layer constituting a blue LED. The employed GaN substrate had a diameter of 50 mm (2 inches) and a thickness of approximately 0.35 mm.

The epitaxial layer of the LED had a structure of Mg doped GaN (50 nm)/Mg doped $Al_{0.07}$ GaN (20 nm)/[GaN (15 nm)/$In_{0.15}$ GaN (3 nm)]×3/Si doped $In_{0.05}$ GaN (50 nm)/Si doped GaN (2 μm)/GaN substrate. TMG (trimethyl gallium), TMA (trimethyl aluminium), TMI (trimethyl indium), $Cp_2Mg$ (biscyclopentadienyl magnesium), MMSi (monomethylsilane), and $NH_3$ (ammonia) were employed for the raw material. Hydrogen and nitrogen were employed for the carrier gas. The growth temperature was approximately 780° C. at [GaN (15 nm)/$In_{0.15}$ GaN (3 nm)] MQW (Multiple Quantum Well), and 1100° C. at other layers.

Figure 12:
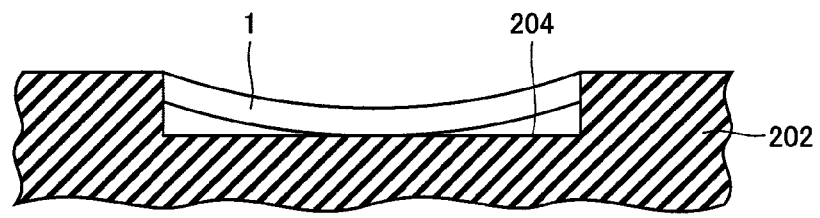
FIG. 12 is a schematic diagram corresponding to the case where a substrate is loaded to a susceptor of Conventional Example 1 and heated.

As shown in FIG. 12, heated substrate 1 was warped in a concave manner such that the center region of substrate 1 forms contact with the bottom of pocket 204 whereas the outer peripheral region does not form contact with the bottom of pocket 204. It is thought that the difference in temperature between the back side of substrate 1 facing susceptor 202 and the top surface of substrate 1 opposite to this back side contributes to this warping.

Figure 13:
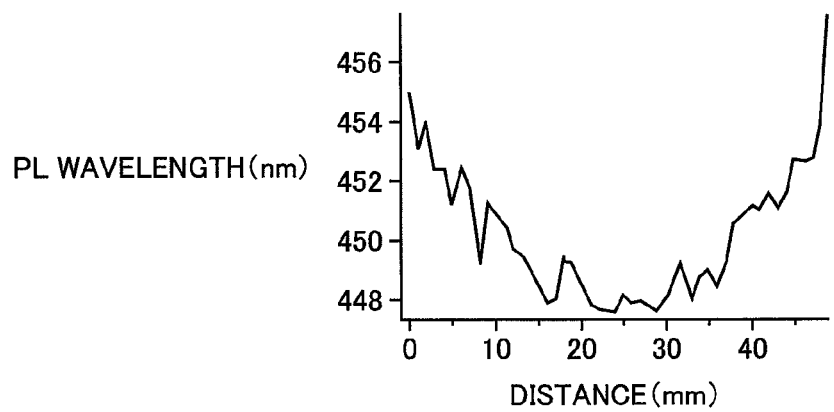
FIG. 13 is a graph representing the results of measuring the wavelength distribution at the substrate surface of Conventional Example 1.

The produced blue LED wafer of Conventional Example 1 was employed to measure the wavelength distribution at the substrate surface by the photoluminescence method. FIG. 13 represents the PL wavelength at respective points across the diameter of substrate 1 circular in plane, when scanned along the surface of substrate 1. The horizontal axis of FIG. 13 represents the distance of substrate 1 in the diameter direction (unit: mm), wherein the center of substrate 1 is set to correspond to the point of 25 mm. The vertical axis in FIG. 13 represents the PL wavelength (unit: nm). The average wavelength was 450 nm. As shown in FIG. 13, the PL wavelength is short at the center of substrate 1, becoming longer towards the outer peripheral region. It is thought that, due to the warping of substrate 1 in a concave manner with the center region in contact with susceptor 202 and the outer peripheral region in a floating state, the temperature becomes high at the center region of substrate 1, which in turn reduces the ratio of the In composition in the InGaN well layer to exhibit a shorter wavelength.

Conventional Example 2

Figure 14:
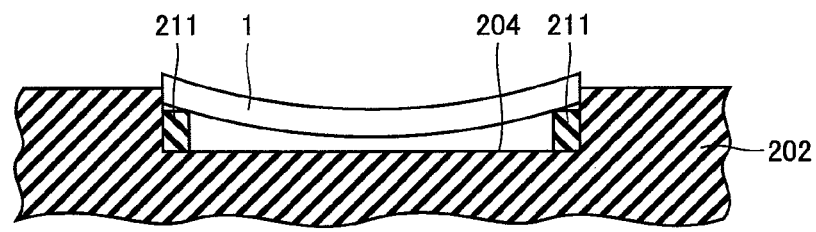
FIG. 14 is a schematic diagram corresponding to the case where a substrate is loaded to a susceptor of Conventional Example 2 and heated.

A quartz-made ring was inserted at the outer peripheral region in pocket 204 to avoid the central region contact between substrate 1 and susceptor 202, encountered in Conventional Example 1. The structure of Conventional Example 2 differed from the structure of Conventional Example 1 only in that a quartz ring 211 to support substrate 1 was added in pocket 204 of susceptor 202. Quartz ring 211 had a width (the dimension in the horizontal direction in FIG. 14, corresponding to radial direction of substrate 1) of 1.0 mm, and a thickness (the dimension in the vertical direction in FIG. 14, corresponding to the depth direction of pocket 204) of 0.2 mm. Using this susceptor 202, epitaxial growth was effected on the surface of substrate 1, similar to Conventional Example 1.

Figure 15:
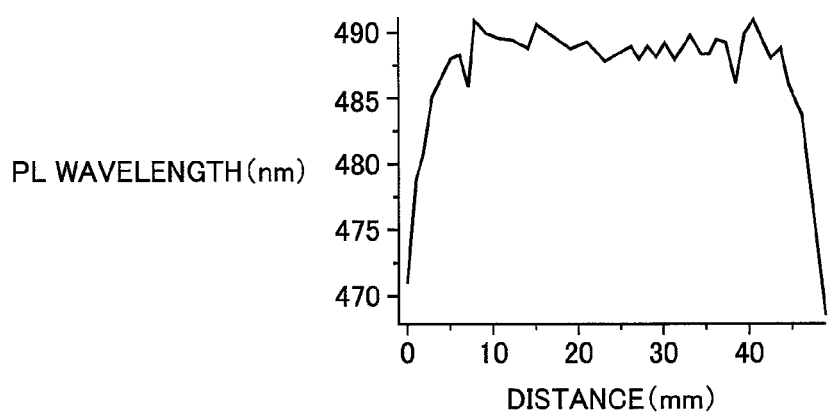
FIG. 15 is a graph representing the results of measuring the wavelength distribution at the substrate surface of Conventional Example 2.

The produced blue LED wafer of Conventional Example 2 was employed to measure the wavelength distribution at the substrate surface by the photoluminescence method. Respective points of measurements and the coordinate axes in the graph of FIG. 15 are similar to those of FIG. 13. In Conventional Example 2, the average wavelength was 485 nm. As shown in FIG. 15, the PL wavelength was shorter at the outer peripheral region of substrate 1, representing a tendency opposite to that of Conventional Example 1. The range of the effect of the PL wavelength becoming shorter at the outer peripheral region extended across approximately 5 mm in the radial direction of substrate 1. It is thought that, due to the temperature reduction at the central region of substrate 1 by avoiding contact between substrate 1 and susceptor 202 at the central region of substrate 1, the ratio of the In composition in the InGaN well layer is increased to lead to a longer photoluminescence wavelength. In contrast, the temperature of substrate 1 at the outer peripheral region is higher due to the contact with quartz ring 211, causing the ratio of the In composition in the InGaN well layer to be reduced to lead to a shorter photoluminescence wavelength.

Conventional Example 3

Figure 16:
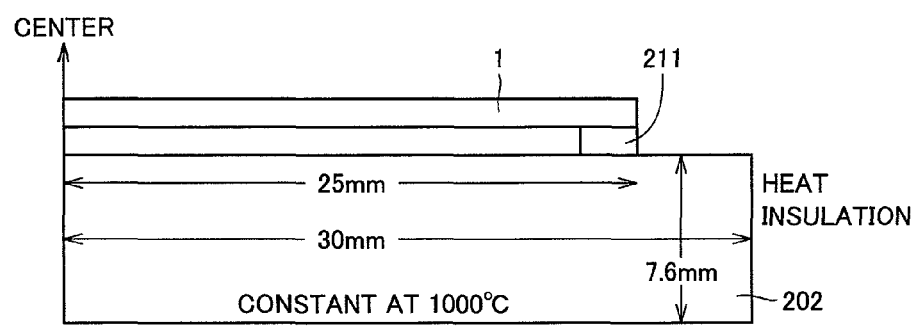
FIG. 16 represents a simulation model of Conventional Example 3.

The temperature distribution at the surface of substrate 1 in the case where quartz ring 211 of Conventional Example 2 was inserted was obtained by the radiation heat transfer simulation. Based on an axisymmetric model as shown in FIG. 16, a two-dimensional simulation was performed in relation to substrate 1 for a length (25 mm) corresponding to the radius thereof. The dimension of susceptor 202 in the direction corresponding to the radial direction of substrate 1 was 30 mm, and in the direction corresponding to the thickness direction of substrate 1 was 7.6 mm. The thickness of substrate 1 was 0.35 mm. The width (dimension in the radial direction of substrate 1) and the thickness (dimension in the thickness direction of substrate 1) of quartz ring 211 was 1.0 mm and 0.2 mm, respectively. The side of susceptor 202 at the back side was set constant at 1000° C., and the side corresponding to the outer circumferential side of susceptor 202 was heat-insulated. It was assumed that the gap between substrate 1 and susceptor 202 was filled with the raw material gas of ammonia.

Figure 17:
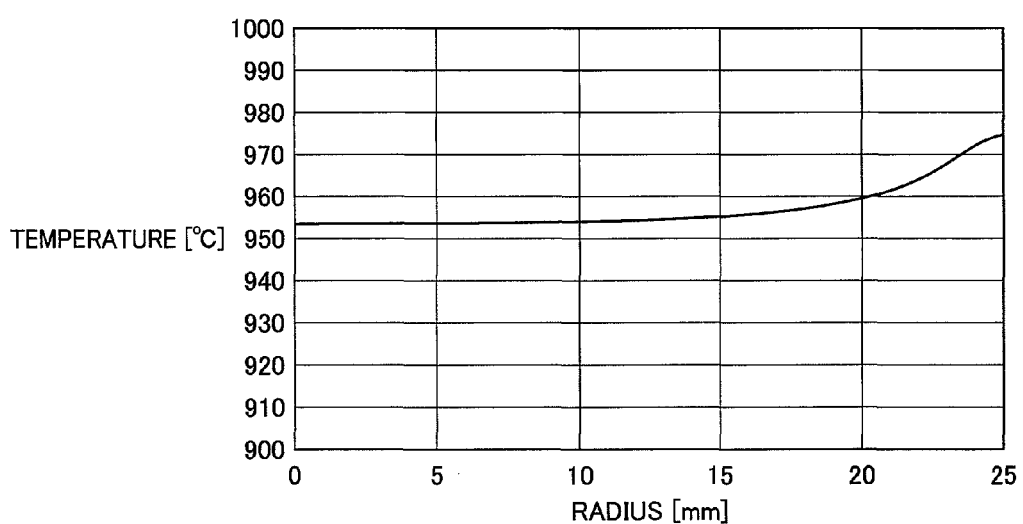
FIG. 17 is a graph representing the simulation result of Conventional Example 3.
Figure 18:
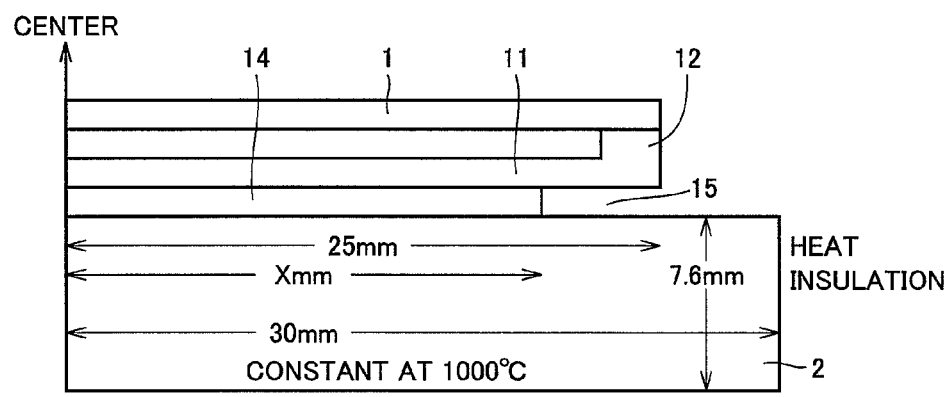
FIG. 18 represents a simulation model of Example 1.

The horizontal axis in FIG. 17 takes the point corresponding to the center of substrate 1 as the origin in the radial direction (distance 0 mm), and represents the distance of respective points radially outwards from the origin. The vertical axis in FIG. 17 represents the temperature at the surface of substrate 1.

As shown in FIG. 17, there was a tendency of temperature reduction from the outer circumferential side towards the center of substrate 1 (namely, as the coordinate of the horizontal axis, representing the distance from the center of substrate 1 in the radial direction, becomes smaller). This phenomenon matches the results of the experiment indicated in Conventional Example 2. The difference in temperature between the outer peripheral region and the center of substrate 1 was approximately 20° C. It is empirically appreciated that the PL wavelength is reduced by 15 nm when the temperature rises 10° C. in association with the relationship between the PL wavelength and substrate surface temperature. Therefore, the PL wavelength difference of approximately 20 nm obtained through the results of the experiment of Conventional Example 2 corresponds to a temperature difference of approximately 13° C. In other words, the simulation result of Conventional Example 3 was substantially equal to the temperature difference obtained based on the results of the experiment of Conventional Example 2.

Example 1

The temperature distribution at the surface of substrate 1 corresponding to the configuration of support member 11 and spacer 14 of FIG. 3 was derived by radiation heat transfer simulation. Similar to the simulation model of Conventional Example 3 shown in FIG. 16, two-dimensional simulation for a length (25 mm) corresponding to the radius of substrate 1 was performed. The size and boundary conditions related to susceptor 2 were identical to those of Conventional Example 3. The calculation was based on adjusting the width of gap 15 between susceptor 2 and support member 11, i.e. the dimension of gap 15 in the radial direction of substrate 1, by altering the dimension (X) of spacer 14 in the radial direction, in the attempt to optimize the temperature distribution of substrate 1.

The thickness of substrate 1 and spacer 14 was set to 0.35 mm and 0.2 mm, respectively. The thickness of support member 11 was set to 0.5 mm at regions other than the region of support portion 12, and 0.7 mm at the region of support portion 12. The material of spacer 14 and support member 11 was carbon and quartz, respectively. The material of substrate 1 was sapphire. The ambient temperature was set constant at 100° C.

Figure 19:
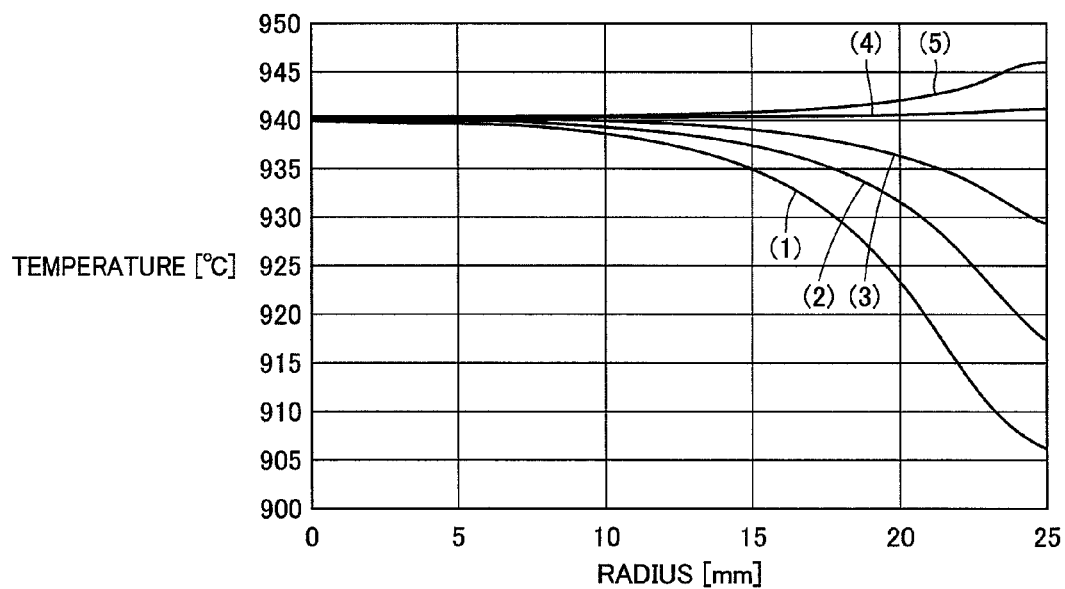
FIG. 19 is a graph representing the simulation result of Example 1.

Lines (1)-(5) in the graph of FIG. 19 represent the calculation result of the surface temperature distribution of substrate 1 at X=21, 23, 24, 24.8 and 25 mm, respectively. As shown in FIG. 19, the temperature at the outer peripheral region of substrate 1 became lower than that at the center region when the dimension of spacer 14 in the radial direction was not more than 24 mm (lines (1)-(3)). In the case where the dimension of spacer 14 in the radial direction was 25 mm (line (5)), with no gap 15, the temperature of substrate 1 at the outer peripheral region was higher than that at the center region.

It was appreciated that the surface temperature of substrate 1 can be set substantially uniform, as shown in FIG. 19, by setting the dimension of spacer 14 in the radial direction to 24.8 mm (line (4)). It is considered that the optimum X value to set the surface temperature of substrate 1 uniform can be further reduced by employing a material of higher thermal conductivity for support member 11, allowing the range of tolerance in the production of spacer 14 to be increased.

Example 2

Figure 20:
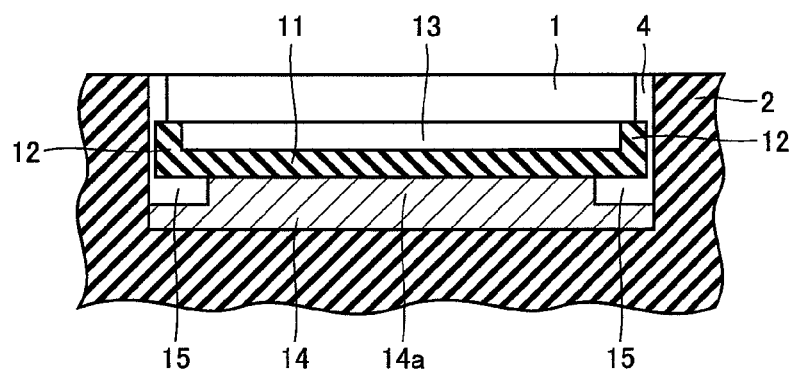
FIG. 20 is a schematic diagram representing a substrate of Example 2 held at a susceptor.
Figure 21:
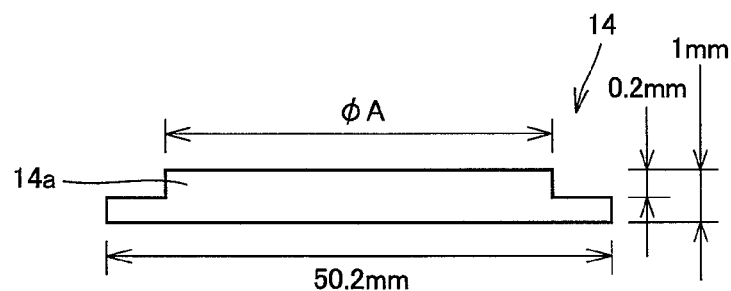
FIG. 21 is a side view of a spacer of Example 2.

A support member 11 of FIG. 20 was of quartz material, identical to that of Example 1. The size of support member 11 was also identical to that of Example 1. Susceptor 2 and spacer 14 were made from carbon coated with SiC. As shown in FIGS. 20 and 21, spacer 14 circular in plane had an outer diameter of 50.2 mm, corresponding to a size to be exactly fitted in pocket 4 of susceptor 2, thus eliminating any position deviation of spacer 14 in pocket 4. At the surface of spacer 14 excluding the outer peripheral region, a stepped portion 14a circular in plane, protruding in the form of a table, was provided. Support member 11 was arranged on stepped portion 14a. Accordingly, there was provided a configuration in which gap 15 having a dimension of 0.2 mm in the thickness direction of substrate 1 was located between support member 11 and susceptor 2, at the back side of support member 11 opposite to the side that faces substrate 1. The width of gap 15 can be modified by altering the dimension ($\phi$A) of stepped portion 14a in the radial direction of spacer 14 shown in FIG. 21.

In pocket 4 of susceptor 2, a GaN substrate of 50 mm (2 inches) in diameter and approximately 0.35 mm in thickness was loaded to support member 11. Employing a spacer 14 of $\phi$A=46, 48 and 49 mm, epitaxial growth was effected on the surface of substrate 1 based on a configuration and film forming condition for an epitaxial layer similar to those of Conventional Example 1 to produce a blue LED. For the materials of susceptor 2 and spacer 14, a material that has corrosion resistance to ammonia gas such as SiC, BN, PBN (pyrolytic BN), a composite material of AlN and BN, a composite material of $Si_3N_4$ and BN, and quartz may be employed, other than the SiC-coated carbon.

Figure 22:
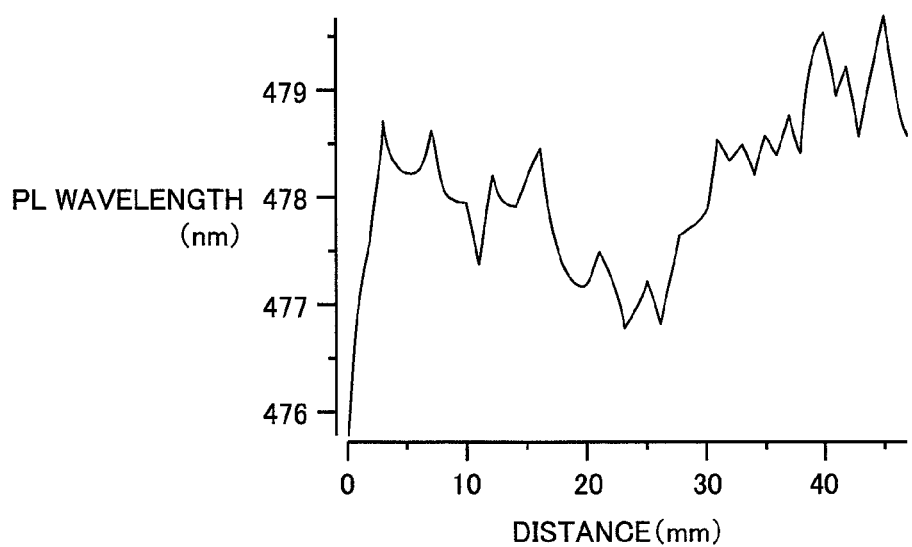
FIG. 22 is a graph representing the results of measuring the wavelength distribution of the substrate surface of Example 2.

As a result of the measurements of the PL wavelength distribution for each blue LED, it was identified that the PL wavelength distribution was most favorable when $\phi$A=48 mm. The blue LED wafer of Example 2 produced employing a spacer 14 of $\phi$A=48 mm was employed to measure the wavelength distribution at the surface of the substrate by the photoluminescence method. The points of measurement and coordinate axes in the graph of FIG. 22 are identical to those of FIG. 13. As shown in FIG. 22, the PL wavelength of Example 2 was in the range of ±1.7 nm, indicating that the PL wavelength distribution was improved, as compared to Conventional Example 1 of FIG. 13 and Conventional Example 2 of FIG. 15. It was found that the usage of a spacer 14 that can have a gap 15 formed between support member 11 and susceptor 2 allowed the temperature distribution of substrate 1 to be rendered uniform. It became apparent that the quality of the film of the semiconductor layer formed at the surface of substrate 1 can be improved.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A fabrication apparatus for a semiconductor device, comprising:

a susceptor holding a substrate, a heater member arranged at a back side of said susceptor, opposite to a side where said susceptor holds said substrate, for heating said substrate, a support member located between said substrate and said susceptor, including a support portion supporting said substrate, said support portion supports an outer peripheral region of said substrate, such that said support member forms contact with said substrate at the outer peripheral region through support portion, and a disk-shaped spacer being located between said susceptor and said support member at an opposite face side of said support member, having an opening formed at an outer peripheral region of said spacer corresponding to a site where said support portion is located.

2. The fabrication apparatus for a semiconductor device according to claim 1, wherein said opening is filled with a material having a lower thermal conductivity than said spacer.

3. The fabrication apparatus for a semiconductor device according to claim 1, wherein said support portion is formed of projections at at least three sites.

4. A fabrication method of a semiconductor device, employing the fabrication apparatus defined in claim 1, comprising the steps of:

loading said substrate to said susceptor, and heating said substrate by said heater member.

5. The fabrication method of a semiconductor device according to claim 4, wherein a semiconductor includes a nitride type compound semiconductor.

6. The fabrication method of a semiconductor device according to claim 5, wherein said semiconductor device includes a semiconductor light emitting element.

\* \* \* \* \*